(12) United States Patent
Ono et al.

(10) Patent No.: US 8,947,279 B2
(45) Date of Patent: Feb. 3, 2015

(54) DELTA/SIGMA MODULATOR (71) Applicant: Kabushiki Kaisha Toshiba, Minato-ku, Tokyo (JP)

(72) Inventors: Daiki Ono, Yokohama (JP); Jun Deguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/178,012

(22) Filed: Feb. 11, 2014

(65) Prior Publication Data

US 2015/0009054 A1  Jan. 8, 2015

(30) Foreign Application Priority Data

Jul. 5, 2013  (JP) ................................ 2013-141779

(51) Int. Cl.
*H03M 3/00* (2006.01)
*H03M 1/12* (2006.01)
*H03M 7/30* (2006.01)
*H03M 1/00* (2006.01)

(52) U.S. Cl.
CPC . *H03M 3/30* (2013.01); *H03M 1/12* (2013.01); *H03M 7/30* (2013.01); *H03M 1/00* (2013.01)
USPC .......................................... 341/143; 341/155

(58) Field of Classification Search
CPC ........... H03M 3/30; H03M 1/12; H03M 1/00; H03M 7/30; H03M 7/3048
USPC ....................... 341/143, 155, 156, 120, 76, 77
See application file for complete search history.

(56) References Cited

U.S. PATENT DOCUMENTS 5,278,559 A * 1/1994 Yazawa .......................... 341/143
2011/0140940 A1 * 6/2011 Cho et al. ...................... 341/143

OTHER PUBLICATIONS

Paavola et al.: "A Micropower Δσ-Based Interface ASIC for a Capacitive 3-Axis Micro-Accelerometer", IEEE Journal of Solid-State Circuits, vol. 44, No. 11, Nov. 2009, pp. 3193-3210 (in English).
Lemkin et al.: "A Three-Axis Micromachined Accelerometer with a CMOS Position-Sense Interface and Digital Offset-Trim Electronics", IEEE Journal of Solid-State Circuits, vol. 34, No. 4, Apr. 1999, pp. 456-468 (in English).
Bruschi et al.: "A Current-Mode, Dual Slope, Integrated Capacitance-to-Pulse Duration Converter", IEEE Journal of Solid-State Circuits, vol. 42, No. 9, Sep. 2007, pp. 1884-1891 (in English).

(Continued)

*Primary Examiner* — Joseph Lauture
(74) *Attorney, Agent, or Firm* — Holtz, Holtz, Goodman & Chick PC (57) ABSTRACT

According to one embodiment, a delta/sigma modulator includes a first multiplier based on a reference capacitor having capacitance $C_R$ and a first variable capacitor having capacitance $C_{S1}$ according to a distance between electrodes thereof, the first multiplier being defined by a first multiplier factor given by $C_R/C_{S1}$ and being supplied with a reference voltage, a second multiplier based on a second variable capacitor having capacitance $C_{S2}$ and a third variable capacitor having capacitance $C_{S3}$, the second multiplier being defined by a second multiplier factor given by $C_{S3}/C_{S2}$ and being provided in a feedback path, and an adder configured to add an output of the first multiplier and an output of the second multiplier, wherein $C_{S1}$, $C_{S2}$ and $C_{S3}$ are the same.

20 Claims, 3 Drawing Sheets (56) References Cited

OTHER PUBLICATIONS

Fujimori et al.: "Tiny (0.72 mm2) Pressure Sensor Integrating MEMS and CMOS LSI With Back-End-Of-Line MEMS Platform", Transducers, Jun. 21-25, 2009, pp. 1924-1927 (in English).

Robinet et al.: "A CMOS-SOI 2.45GHz Remote-Powered Sensor Tag", International Solid-State Circuits Conference, Feb. 5, 2008, Session 15, pp. 286-287 (in English).

* cited by examiner

FIG. 5

DELTA/SIGMA MODULATOR

CROSS-REFERENCE TO RELATED APPLICATIONS

This application is based upon and claims the benefit of priority from Japanese Patent Application No. 2013-141779, filed Jul. 5, 2013, the entire contents of which are incorporated herein by reference.

FIELD

Embodiments described herein relate generally to a delta/sigma modulator (ΔΣ modulator).

BACKGROUND

In recent years, wide attention is focused on a capacitive sensor comprising a variable capacitor whose capacitance varies according to the distance between electrodes. The capacitive sensor is applicable to, for example, a pressure sensor. In an application which requires capacitance to be detected with high accuracy, an analog-to-digital converter having a ΔΣ modulator is used.

However, it has been technically difficult to obtain linear input/output characteristics in a conventional ΔΣ modulator, and a ΔΣ modulator having high accuracy has been in great demand in this field.

DETAILED DESCRIPTION

In general, according to one embodiment, a delta/sigma modulator includes: a first multiplier based on a reference capacitor having capacitance $C_R$ and a first variable capacitor having first variable capacitance $C_{S1}$ according to a distance between electrodes thereof, the first multiplier being defined by a first multiplier factor given by $C_R/C_{S1}$ and being supplied with a reference voltage; a second multiplier based on a second variable capacitor having second variable capacitance $C_{S2}$ and a third variable capacitor having third variable capacitance $C_{S3}$, the second multiplier being defined by a second multiplier factor given by $C_{S3}/C_{S2}$ and being provided in a feedback path; and an adder configured to add an output of the first multiplier and an output of the second multiplier, wherein the first variable capacitance $C_{S1}$, the second variable capacitance $C_{S2}$, and the third variable capacitance $C_{S3}$ are the same.

Hereinafter, embodiments are described with reference to the drawings.

First Embodiment

Figure 1:
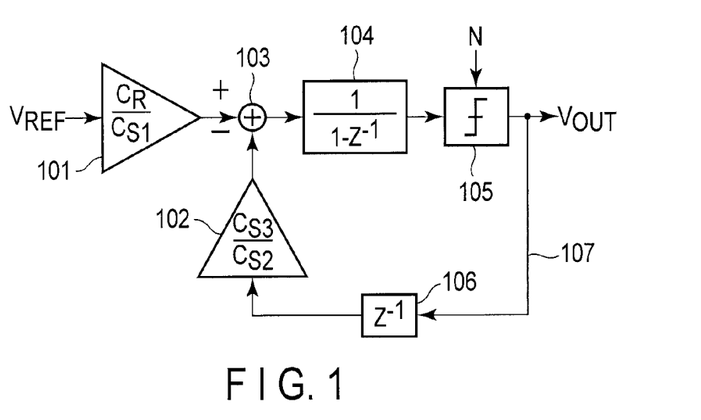
FIG. 1 is a system block diagram illustrating a structure of a ΔΣ modulator of a first embodiment.

FIG. 1 is a system block diagram illustrating a structure of a ΔΣ modulator (primary ΔΣ modulator) of a first embodiment.

The ΔΣ modulator shown in FIG. 1 comprises a first multiplier 101, second multiplier 102, adder 103, integrator 104, comparator 105, delay element (delay circuit) 106, and feedback path 107.

The first multiplier 101 is based on a reference capacitor having capacitance $C_R$ and a first variable capacitor having first variable capacitance $C_{S1}$ according to a distance between electrodes. The first multiplier 101 is defined by a multiplier factor given by $C_R/C_{S1}$. Furthermore, reference voltage (reference signal) $V_{REF}$ is supplied to the first multiplier 101. Thus, the first multiplier 101 outputs a signal given by $V_{REF} \times (C_R/C_{S1})$.

The second multiplier 102 is based on a second variable capacitor having second variable capacitance $C_{S2}$ and a third variable capacitor having third variable capacitance $C_{S3}$. The second multiplier 102 is defined by a multiplier factor given by $C_{S3}/C_{S2}$. Furthermore, the second multiplier 102 is in the feedback path 107.

The first variable capacitance $C_{S1}$, second variable capacitance $C_{S2}$, and third variable capacitance $C_{S3}$ are equal. Therefore, the multiplier factor $C_{S3}/C_{S2}$ of the second multiplier 102 is 1.

Furthermore, the reference capacitor, first variable capacitor, second variable capacitor, and third variable capacitor are on the same substrate.

Furthermore, the first variable capacitor and second variable capacitor may use a common variable capacitor.

The adder 103 adds the output of the first multiplier 101 and the output of the second multiplier 102. Specifically, the output value of the first multiplier 101 and the output value of the second multiplier 102 whose sign is reversed are added together. That is, the output value of the first multiplier 101 minus the output value of the second multiplier 102 is the value obtained in the adder 103.

The integrator 104 is coupled to the output of the adder 103, and an operation given by $1/(1-Z^{-1})$ is carried out in the integrator 104. Here, $Z^{-1}$ is a delay element (for example, one clock delay element [delay function]).

The comparator 105 is coupled to the output of the integrator 104. The comparator 105 functions as a quantizer. In FIG. 1, N is a quantization error. The comparator 105 outputs output voltage (output signal) $V_{OUT}$.

The delay element 106 is in the feedback path 107 and coupled between the output of the comparator 105 and the input of the second multiplier 102. The delay element 106 functions as, for example, one clock delay element.

Figure 2:
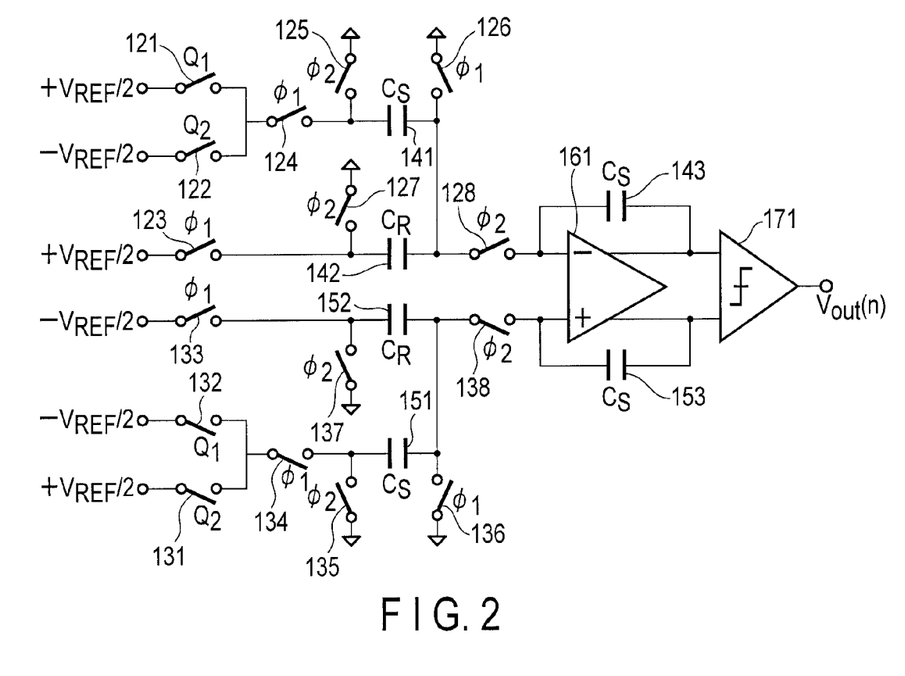
FIG. 2 is a schematic circuit diagram indicating a structure of the ΔΣ modulator of the first embodiment.

FIG. 2 is a schematic circuit diagram indicating a structure of the ΔΣ modulator of the first embodiment. That is, FIG. 2 is a schematic circuit diagram indicating a specific structure of the ΔΣ modulator shown in the system block diagram of FIG. 1.

The ΔΣ modulator shown in FIG. 2 includes switches 121 to 128 and switches 131 to 138. The switches are structured by, for example, transistors.

Voltage $+V_{REF}/2$ is supplied to the switched 121, 123, and 131. Voltage $-V_{REF}/2$ is supplied to the switches 122, 132, and 133.

The switches 121 and 132 are turned on when $Q_1=1$ and the switches 122 and 131 are turned on when $Q_2=1$. Here, $Q_1=1$ applies when $V_{out}(n-1)$=logical low, and $Q_2=1$ applies when $V_{out}(n-1)$=logical high. Note that $V_{out}(n-1)$ is the output voltage at a timing of n−1 which is one clock before a timing n.

A signal $\phi_1$ is supplied to the switches 123, 124, 126, 133, 134, and 136. A signal $\phi_2$ is supplied to the switches 125, 127, 128, 135, 137, and 138. The signal $\phi_1$ and signal $\phi_2$ are clock signals having anti-phase to each other (duty 50%).

Furthermore, the ΔΣ modulator shown in FIG. 2 includes the capacitors 141, 142, 143, 151, 152, and 153. The capacitors 141, 143, 151, and 153 are variable capacitors having the same variable capacitance $C_S$. The capacitors 142 and 152 are constant capacitors having the same capacitance $C_R$. The capacitors 141, 142, 143, 151, 152, and 153 are on the same substrate.

Furthermore, the ΔΣ modulator shown in FIG. 2 includes an operational amplifier 161 and a comparator 171. The comparator 171 outputs output voltage (output signal) $V_{OUT}(n)$ (output voltage at the timing n).

Now, a technical relationship between the system block diagram shown in FIG. 1 and the schematic circuit diagram shown in FIG. 2 is explained.

The reference capacitor (capacitance $C_R$) of the first multiplier 101 shown in FIG. 1 corresponds to the capacitors 142 and 152 shown in FIG. 2. Furthermore, the variable capacitor (capacitance $C_{S1}$) of the first multiplier 101 shown in FIG. 1 corresponds to the capacitors 143 and 153 shown in FIG. 2.

The second variable capacitor (capacitance $C_{S2}$) of the second multiplier 102 shown in FIG. 1 corresponds to the capacitors 143 and 153 shown in FIG. 2. The third variable capacitor (capacitance $C_{S3}$) of the second multiplier 102 shown in FIG. 1 corresponds to the capacitors 141 and 151 shown in FIG. 2.

The adder 103 shown in FIG. 1 corresponds to a connection point of the capacitors 141 and 142 and the switch 128 in FIG. 2, and also corresponds to a connection point of the capacitors 151 and 152 and the switch 138 in FIG. 2.

The integrator 104 shown in FIG. 1 corresponds to a part including the capacitors 143 and 153 and the operational amplifier 161 in FIG. 2. The comparator 105 shown in FIG. 1 corresponds to the comparator 171 shown in FIG. 2. The delay element 106 shown in FIG. 1 is the delay element based on signal $\phi_1$ and signal $\phi_2$ in FIG. 2.

As mentioned above, the capacitors 141, 143, 151, and 153 are variable capacitors having the same variable capacitance C. The variable capacitors 141, 143, 151, and 153 are formed using a micro-electromechanical system (MEMS) technique.

Figure 3:
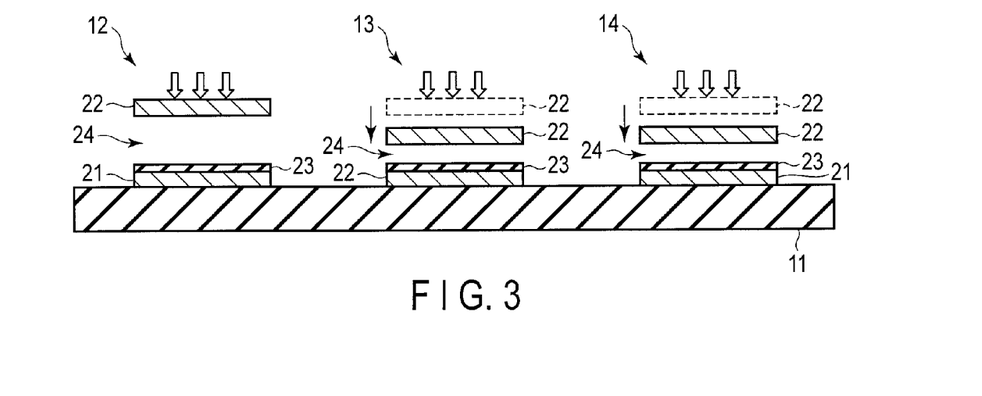
FIG. 3 is a schematic cross-sectional view of a structure of the variable capacitor and the reference capacitor of the first embodiment.

FIG. 3 is a schematic cross-sectional view of a structure of the variable capacitor and the reference capacitor of the present embodiment.

A reference capacitor 12, variable capacitor 13, and variable capacitor 14 are formed on an underlying region 11 including a semiconductor substrate. The reference capacitor 12 corresponds to, for example, the reference capacitor 142 shown in FIG. 2. The variable capacitors 13 and 14 correspond to, for example, the variable capacitors 141 and 143 shown in FIG. 2, respectively.

Each of the capacitors 12, 13, and 14 includes a lower electrode 21, upper electrode 22, and insulating film 23 formed on the lower electrode 21. Furthermore, there is a space 24 between the upper electrode 22 and the insulating film 23.

The upper electrode 22 is variable in each of the variable capacitors 13 and 14. More specifically, when a pressure is applied to the upper electrode 22, the upper electrode 22 moves in a vertical direction according to the strength of the pressure, and thereby, a distance between the lower electrode 21 and the upper electrode 22 changes so the capacitance of each of the variable capacitors 13 and 14 changes as well. Since the variable capacitors 13 and 14 are on the same substrate, the distance between the electrodes in the variable capacitor 13 and the distance between the electrodes in the variable capacitor 14 are maintained corresponding to each other even if the upper electrodes 22 move in both capacitors. Furthermore, an area of the electrodes in the variable capacitor 13 and an area of the electrodes in the variable capacitor 14 are equal. Therefore, the capacitance of the variable capacitor 13 and the capacitance of the variable capacitor 14 are always maintained equally.

In the reference capacitor 12, a distance between the lower electrode 21 and the upper electrode 22 is fixed. Therefore, the capacitance of the reference capacitor 12 is fixed to a constant value.

The output voltage (output signal) $V_{OUT}$ of the ΔΣ modulator shown in FIG. 1 is given by the following equation.

$$V_{OUT} = \frac{\frac{C_R}{C_S}V_{REF} + (1-Z^{-1})N}{\left(\frac{C_S}{C_S}-1\right)Z^{-1}+1}$$

Here, since $C_{S3}/C_{S2}=1$, the denominator of the above equation is 1, and the above equation can be rewritten as:

$$V_{OUT}=(C_R/C_{S1})V_{REF}+(1-X^{-1})N$$

As can be understood from the above, the output voltage $V_{OUT}$ of the ΔΣ modulator varies inversely as the capacitance $C_{S1}$ of the variable capacitor.

Here, the capacitance $C_S$ of the variable capacitor is given by:

$$C_S=\in \times (S/d)$$

where $\in$ is the dielectric constant, S is the area of electrodes in the capacitor, and d is the distance between the electrodes of the capacitor.

Therefore, the output voltage $V_{OUT}$ of the ΔΣ modulator is given by:

$$V_{OUT}=C_R(d/\in S)V_{REF}+(1-Z^{-1})N$$

As can be understood from the above, the output voltage $V_{OUT}$ of the ΔΣ modulator varies in proportion as d: the distance between the electrodes of the variable capacitor. Furthermore, the distance d varies in proportion as pressure P applied on the upper electrode of the variable capacitor. That is, the output voltage $V_{OUT}$ of the ΔΣ modulator varies in proportion as the pressure P applied to the upper electrode of the variable capacitor. In other words, considering that the pressure P is an input, what is realized here is the ΔΣ modulator having linear input/output characteristics.

As can be understood from the above, a highly accurate ΔΣ modulator having linear input/output characteristics between an input (pressure P) and output (voltage $V_{OUT}$) is achievable from the present embodiment. By using the ΔΣ modulator of the present embodiment, a highly accurate analog-to-digital convertor can be configured and a highly accurate pressure sensor can be realized.

Second Embodiment

Figure 4:
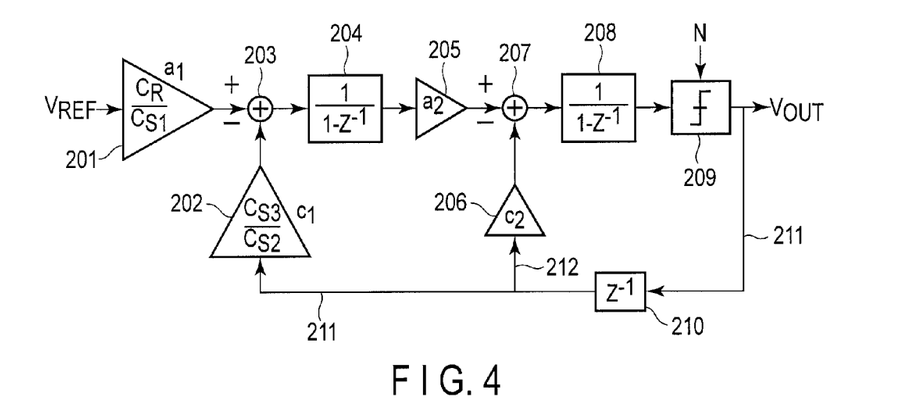
FIG. 4 is a system block diagram illustrating a structure of a ΔΣ modulator of a second embodiment.

FIG. 4 is a system block diagram illustrating a structure of a ΔΣ modulator (secondary ΔΣ modulator) of a second embodiment. Since the structure basically the same as that of the first embodiment shown in FIG. 1, the matters described in the description of the first embodiment are omitted hereinafter.

The ΔΣ modulator shown in FIG. 4 comprises a first multiplier 201, second multiplier 202, first adder 203, first integrator 204, third multiplier 205, fourth multiplier 206, second adder 207, second integrator 208, comparator 209, delay element (delay circuit) 210, feedback path 211, and branch path 212.

The first multiplier 201 is based on a reference capacitor having capacitance $C_R$ and a first variable capacitor having first variable capacitance $C_S$ according to a distance between electrodes. The first multiplier 201 is defined by a multiplier factor given by $a_1=C_R/C_{S1}$. The first multiplier 201 functions basically the same as the first multiplier 101 shown in FIG. 1.

The second multiplier 202 is based on a second variable capacitor having second variable capacitance $C_{S2}$ and a third variable capacitor having third variable capacitance $C_{S3}$. The second multiplier 202 is defined by a multiplier factor given by $c_1 = C_{S3}/C_{S2}$. Furthermore, the second multiplier 202 is in the feedback path 211. The second multiplier 202 functions basically the same as the second multiplier 102 shown in FIG. 1.

The first variable capacitance $C_{S1}$, second variable capacitance $C_{S2}$, and third variable capacitance $C_{S3}$ are equal. Therefore, the multiplier factor $C_{S3}/C_{S2}$ of the second multiplier 202 is 1.

Furthermore, the reference capacitor, first variable capacitor, second variable capacitor, and third variable capacitor are on the same substrate.

Furthermore, the first variable capacitor and second variable capacitor may use a common variable capacitor.

The first adder 203 adds the output of the first multiplier 201 and the output of the second multiplier 202. The adder 203 functions basically the same as the adder 103 shown in FIG. 1.

The first integrator 204 is coupled to the output of the adder 203. The first integrator 204 functions basically the same as the integrator 104 shown in FIG. 1.

The third multiplier 205 is coupled to the output from the first integrator 204. The multiplier factor of the third multiplier 205 is $a_2$ ($a_2=1$). The fourth multiplier 206 is coupled to the branch path 212 of the feedback path 211. The multiplier factor of the fourth multiplier 206 is $c_2$ ($c_2=1$).

The second adder 207 adds the output of the third multiplier 205 and the output of the fourth multiplier 206. Specifically, the output value of the third multiplier 205 and the output value of the fourth multiplier 206 whose sign is reversed are added together. That is, the output value of the third multiplier 205 minus the output value of the fourth multiplier 206 is the value obtained in the second adder 207.

The second integrator 208 is coupled to the output of the second adder 207. The second integrator 208 is structured and functions basically the same as the integrator 104 shown in FIG. 1.

The comparator 209 is coupled to the output of the second integrator 208. The comparator 209 functions as a quantizer. In FIG. 4, N is a quantization error. The comparator 209 outputs output voltage (output signal) $V_{OUT}$.

The delay element 210 is in the feedback path 211 and coupled between the output of the comparator 209 and the input of the second multiplier 202, and coupled between the output of the comparator 209 and the input of the fourth multiplier 206. The delay element 210 functions as, for example, one clock delay element.

The variable capacitor and the reference capacitor of the present embodiment are structured basically the same as those of the first embodiment shown in FIG. 3.

The output voltage (output signal) $V_{OUT}$ of the ΔΣ modulator shown in FIG. 4 is given by the following equation.

$$V_{OUT} = \frac{\frac{C_R}{C_S} a_2 V_{REF} + (1-Z^{-1})^2 N}{1 + \left(2 - a_2 \frac{C_S}{C_S} - c_2\right)Z^{-1} + (1-c_2)Z^{-2}}$$

Here, since $C_{S3}/C_{S2}=1$ and $a_2=c_2=1$, the denominator of the above equation is 1, and the above equation can be rewritten as:

$$V_{OUT} = (C_R/C_{S1})V_{REF} + (1-Z^{-1})^2 N$$

As can be understood from the above, the output voltage $V_{OUT}$ of the ΔΣ modulator varies inversely as the capacitance $C_{S1}$ of the variable capacitor.

As in the first embodiment, the capacitance $C_S$ of the variable capacitor is given by:

$$C_S = \in \times (S/d)$$

and therefore, the output voltage $V_{OUT}$ of the ΔΣ modulator is given by:

$$V_{OUT} = C_R(d/\in S)V_{REF} + (1-Z^{-1})^2 N$$

As can be understood from the above, the output voltage $V_{OUT}$ of the μΣ modulator varies in proportion as d: the distance between the electrodes of the variable capacitor. Furthermore, the distance d varies in proportion as pressure P applied on the upper electrode of the variable capacitor. That is, the output voltage $V_{OUT}$ of the ΔΣ modulator varies in proportion as the pressure P applied on the upper electrode of the variable capacitor. In other words, considering that the pressure P is an input, what is realized here is the ΔΣ modulator having linear input/output characteristics.

As can be understood from the above, a highly accurate ΔΣ modulator having linear input/output characteristics between an input (pressure P) and an output (voltage $V_{OUT}$) is, as in the first embodiment, also achievable from the present embodiment. By using the ΔΣ modulator of the present embodiment, a highly accurate analog-to-digital convertor can be configured and a highly accurate pressure sensor can be realized.

Third Embodiment

Figure 5:
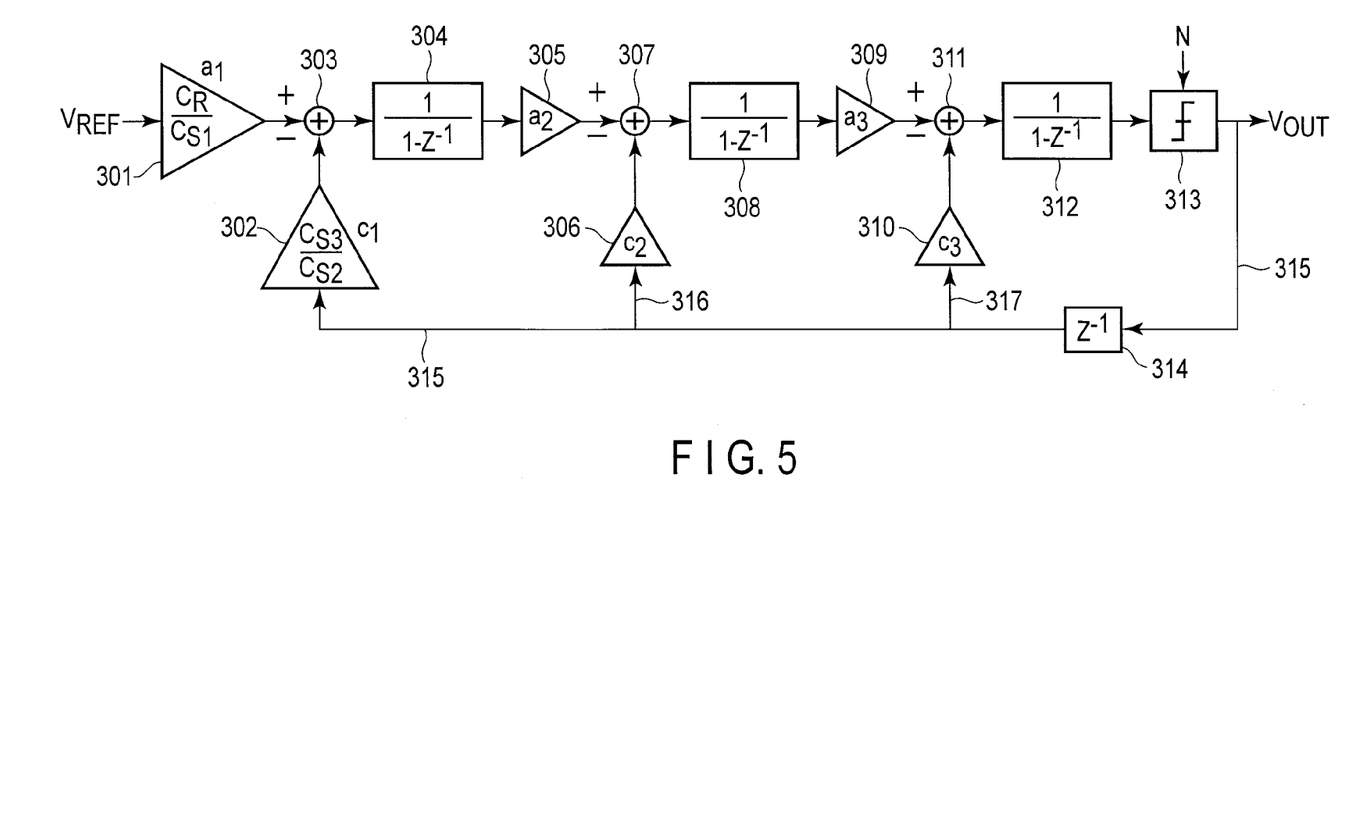
FIG. 5 is a system block diagram illustrating a structure of a ΔΣ modulator of a third embodiment.

FIG. 5 is a system block diagram illustrating a structure of a ΔΣ modulator (tertiary ΔΣ modulator) of a third embodiment. Since the structure basically the same as that of the first embodiment shown in FIG. 1, the matters described in the description of the first embodiment is omitted hereinafter.

The ΔΣ modulator shown in FIG. 5 comprises a first multiplier 301, second multiplier 302, first adder 303, first integrator 304, third multiplier 305, fourth multiplier 306, second adder 307, second integrator 308, fifth multiplier 309, sixth multiplier 310, third adder 311, third integrator 312, comparator 313, delay element (delay circuit) 314, feedback path 315, first branch path 316, and second branch path 317.

The first multiplier 301 is based on a reference capacitor having capacitance $C_R$ and a first variable capacitor having first variable capacitance $C_{S1}$ according to a distance between electrodes. The first multiplier 301 is defined by a multiplier factor given by $a_1 = C_R/C_{S1}$. The first multiplier 301 functions basically the same as the first multiplier 101 shown in FIG. 1.

The second multiplier 302 is based on a second variable capacitor having second variable capacitance $C_{S2}$ and a third variable capacitor having third variable capacitance $C_{S3}$. The second multiplier 302 is defined by a multiplier factor given by $c_1 = C_{S3}/C_{S2}$. Furthermore, the second multiplier 302 is in the feedback path 315. The second multiplier 302 functions basically the same as the second multiplier 102 shown in FIG. 1.

The first variable capacitance $C_{S1}$, second variable capacitance $C_{S2}$, and third variable capacitance $C_{S3}$ are equal. Therefore, the multiplier factor $C_{S3}/C_{S2}$ of the second multiplier 202 is 1.

Furthermore, the reference capacitor, first variable capacitor, second variable capacitor, and third variable capacitor are on the same substrate.

Furthermore, the first variable capacitor and second variable capacitor may use a common variable capacitor.

The first adder 303 adds the output of the first multiplier 301 and the output of the second multiplier 302. The adder 303 functions basically the same as the adder 103 shown in FIG. 1.

The first integrator 304 is coupled to the output of the adder 303. The first integrator 304 functions basically the same as the integrator 104 shown in FIG. 1.

The third multiplier 305 is coupled to the output of the first integrator 304. The multiplier factor of the third multiplier 305 is $a_2$ ($a_2=1$). The fourth multiplier 306 is coupled to the first branch path 316 of the feedback path 315. The multiplier factor of the fourth multiplier 306 is $c_2$ ($c_2=1$).

The second adder 307 adds the output of the third multiplier 305 and the output of the fourth multiplier 306. Specifically, the output value of the third multiplier 305 and the output value of the fourth multiplier 306 whose sign is reversed are added together. That is, the output value of the third multiplier 305 minus the output value of the fourth multiplier 306 is the value obtained in the second adder 307.

The second integrator 308 is coupled to the output of the second adder 307. The second integrator 308 is structured and functions basically the same as the integrator 104 shown in FIG. 1.

The fifth multiplier 309 is coupled to the output of the second multiplier 308. The multiplier factor of the fifth multiplier 309 is $a_3$ ($a_3=1$). The sixth multiplier 310 is coupled to the second branch path 317 of the feedback path 315. The multiplier factor of the sixth multiplier 310 is $c_3$ ($c_3=1$).

The third adder 311 adds the output of the fifth multiplier 309 and the output of the sixth multiplier 310. Specifically, the output value of the fifth multiplier 309 and the output value of the sixth multiplier 310 whose sign is reversed are added together. That is, the output value of the fifth multiplier 309 minus the output value of the sixth multiplier 310 is the value obtained in the third adder 311.

The third integrator 312 is coupled to the output of the third adder 311. The third integrator 312 functions basically the same as the integrator 104 shown in FIG. 1.

The comparator 313 is coupled to the output of the third integrator 312. The comparator 313 functions as a quantizer. In FIG. 5, N is a quantization error. The comparator 313 outputs output voltage (output signal) $V_{OUT}$.

The delay element 314 is in the feedback path 315. The delay element 314 is coupled between the output of the comparator 313 and the input of the second multiplier 302; the output of the comparator 313 and the input of the fourth multiplier 306; and the output of the comparator 313 and the input of the sixth multiplier 310. The delay element 314 functions as, for example, one clock delay element.

The variable capacitor and the reference capacitor of the present embodiment are structured basically the same as those of the first embodiment shown in FIG. 3.

The output voltage (output signal) $V_{OUT}$ of the $\Delta\Sigma$ modulator shown in FIG. 5 is given by the following equation.

$$V_{OUT} = \frac{\frac{C_R}{C_S}a_2 a_3 V_{REF} + (1-Z^{-1})^3 N}{1+\left(-3+\left(a_2\frac{C_S}{C_S}+c_2\right)a_3+c_3\right)Z^{-1}+(3-a_3 c_2 - 2c_3)Z^{-2}+(-1+c_3)Z^{-3}}$$

Here, since $C_{S3}/C_{S2}=1$ and $a_2=c_2=a_3=c_3=1$, the denominator of the above equation is 1, and the above equation can be rewritten as:

$$V_{OUT}=(C_R/C_{S1})V_{REF}+(1-Z^{-1})^3 N$$

As can be understood from the above, the output voltage $V_{OUT}$ of the $\Delta\Sigma$ modulator varies inversely as the capacitance $C_{S1}$ of the variable capacitor.

As in the first embodiment, the capacitance $C_S$ of the variable capacitor is given by:

$$C_S = \varepsilon \times (S/d)$$

and therefore, the output voltage $V_{OUT}$ of the $\Delta\Sigma$ modulator is given by:

$$V_{OUT}=C_R(d/\varepsilon S)V_{REF}+(1-Z^{-1})^3 N$$

As can be understood from the above, the output voltage $V_{OUT}$ of the $\Delta\Sigma$ modulator varies in proportion as d: the distance between the electrodes of the variable capacitor. Furthermore, the distance d varies in proportion as pressure P applied on the upper electrode of the variable capacitor. That is, the output voltage $V_{OUT}$ of the $\Delta\Sigma$ modulator varies in proportion as the pressure P applied on the upper electrode of the variable capacitor. In other words, considering that the pressure P is an input, what is realized here is the $\Delta\Sigma$ modulator having linear input/output characteristics.

As can be understood from the above, a highly accurate $\Delta\Sigma$ modulator having linear input/output characteristics between an input (pressure P) and an output (voltage $V_{OUT}$) is, as in the first embodiment, also achievable from the present embodiment. By using the $\Delta\Sigma$ modulator of the present embodiment, a highly accurate analog-to-digital convertor can be configured and a highly accurate pressure sensor can be realized.

Note that, the above first, second, and third embodiments have been described referring to a pressure sensor using the $\Delta\Sigma$ modulator; however, the $\Delta\Sigma$ modulator can be applied to other uses instead of the pressure sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A delta/sigma modulator comprising:
   a first multiplier based on a reference capacitor having capacitance $C_R$ and a first variable capacitor having first variable capacitance $C_{S1}$ according to a distance between electrodes thereof, the first multiplier being defined by a first multiplier factor given by $C_R/C_{S1}$ and being supplied with a reference voltage;
   a second multiplier based on a second variable capacitor having second variable capacitance $C_{S2}$ and a third variable capacitor having third variable capacitance $C_{S3}$, the second multiplier being defined by a second multiplier factor given by $C_{S3}/C_{S2}$ and being provided in a feedback path; and
   an adder configured to add an output of the first multiplier and an output of the second multiplier, wherein the first variable capacitance $C_{S1}$, the second variable capacitance $C_{S2}$, and the third variable capacitance $C_{S3}$ are the same.

2. The modulator of claim 1, wherein the reference capacitor, the first variable capacitor, the second variable capacitor, and the third variable capacitor are provided on the same substrate.

3. The modulator of claim 1, wherein an output voltage of the modulator varies in proportion to pressure applied to an upper electrode of each of the first, second, and third variable capacitors.

4. The modulator of claim 1, wherein the adder subtracts an output value of the second multiplier from an output value of the first multiplier.

5. The modulator of claim 1, wherein the first, second, and third variable capacitors are MEMS elements.

6. A delta/sigma modulator comprising:
a first multiplier based on a reference capacitor having capacitance $C_R$ and a first variable capacitor having first variable capacitance $C_{S1}$ according to a distance between electrodes thereof, the first multiplier being defined by a first multiplier factor given by $C_R/C_{S1}$ and being supplied with a reference voltage;
a second multiplier based on a second variable capacitor having second variable capacitance $C_{S2}$ and a third variable capacitor having third variable capacitance $C_{S3}$, the second multiplier being defined by a second multiplier factor given by $C_{S3}/C_{S2}$ and being provided in a feedback path;
an adder configured to add an output of the first multiplier and an output of the second multiplier;
an integrator coupled to an output of the adder;
a comparator coupled to an output of the integrator; and
a delay element provided in a feedback path and coupled between an output of the comparator and an input of the second multiplier, wherein
the first variable capacitance $C_{S1}$, the second variable capacitance $C_{S2}$, and the third variable capacitance $C_{S3}$ are the same.

7. The modulator of claim 6, wherein the reference capacitor, the first variable capacitor, the second variable capacitor, and the third variable capacitor are provided on the same substrate.

8. The modulator of claim 6, wherein an output voltage of the modulator varies in proportion to pressure applied to an upper electrode of each of the first, second, and third variable capacitors.

9. The modulator of claim 6, wherein the adder subtracts an output value of the second multiplier from an output value of the first multiplier.

10. The modulator of claim 6, wherein the first, second, and third variable capacitors are MEMS elements.

11. A delta/sigma modulator comprising:
a first multiplier based on a reference capacitor having capacitance $C_R$ and a first variable capacitor having first variable capacitance $C_{S1}$ according to a distance between electrodes thereof, the first multiplier being defined by a first multiplier factor given by $C_R/C_{S1}$ and being supplied with a reference voltage;
a second multiplier based on a second variable capacitor having second variable capacitance $C_{S2}$ and a third variable capacitor having third variable capacitance $C_{S3}$, the second multiplier being defined by a second multiplier factor given by $C_{S3}/C_{S2}$ and being provided in a feedback path;
a first adder configured to add an output of the first multiplier and an output of the second multiplier;
a first integrator coupled to an output of the first adder;
a third multiplier coupled to an output of the first integrator and defined by a multiplier factor 1;
a fourth multiplier provided in a branch path of the feedback path and defined by a multiplier factor 1;
a second adder configured to add an output of the third multiplier and an output of the fourth multiplier;
a second integrator coupled to an output of the second adder;
a comparator coupled to an output of the second integrator; and
a delay element provided in the feedback path, coupled between an output of the comparator and an input of the second multiplier, and coupled between the output of the comparator and an input of the fourth multiplier, wherein
the first variable capacitance $C_{S1}$, the second variable capacitance $C_{S2}$, and the third variable capacitance $C_{S3}$ are the same.

12. The modulator of claim 11, wherein the reference capacitor, the first variable capacitor, the second variable capacitor, and the third variable capacitor are provided on the same substrate.

13. The modulator of claim 11, wherein an output voltage of the modulator varies in proportion to pressure applied to an upper electrode of each of the first, second, and third variable capacitors.

14. The modulator of claim 11, wherein the first adder subtracts an output value of the second multiplier from an output value of the first multiplier.

15. The modulator of claim 11, wherein the first, second, and third variable capacitors are MEMS elements.

16. A delta/sigma modulator comprising:
a first multiplier based on a reference capacitor having capacitance $C_R$ and a first variable capacitor having first variable capacitance $C_{S1}$ according to a distance between electrodes thereof, the first multiplier being defined by a first multiplier factor given by $C_R/C_{S1}$ and being supplied with a reference voltage;
a second multiplier based on a second variable capacitor having second variable capacitance $C_{S2}$ and a third variable capacitor having third variable capacitance $C_{S3}$, the second multiplier being defined by a second multiplier factor given by $C_{S3}/C_{S2}$ and provided in a feedback path;
a first adder configured to add an output of the first multiplier and an output of the second multiplier;
a first integrator coupled to an output of the first adder;
a third multiplier coupled to an output of the first integrator and defined by a multiplier factor 1;
a fourth multiplier provided in a first branch path of the feedback path and defined by a multiplier factor 1;
a second adder configured to add an output of the third multiplier and an output of the fourth multiplier;
a second integrator coupled to an output of the second adder;
a fifth multiplier coupled to an output of the second integrator and defined by a multiplier factor 1;
a sixth multiplier provided in a second branch path of the feedback path and defined by a multiplier factor 1;
a third adder configured to add an output of the fifth multiplier and an output of the sixth multiplier;
a third integrator coupled to an output of the third adder;
a comparator coupled to an output of the third integrator; and
a delay element provided in the feedback path, coupled between an output of the comparator and an input of the second multiplier, coupled between the output of the comparator and an input of the fourth multiplier, and coupled between the output of the comparator and an input of the sixth multiplier, wherein
the first variable capacitance $C_{S1}$, the second variable capacitance $C_{S2}$, and the third variable capacitance $C_{S3}$ are the same.

17. The modulator of claim 16, wherein the reference capacitor, the first variable capacitor, the second variable capacitor, and the third variable capacitor are provided on the same substrate.

18. The modulator of claim 16, wherein an output voltage of the modulator varies in proportion to pressure applied to an upper electrode of each of the first, second, and third variable capacitors.

19. The modulator of claim 16, wherein the first adder subtracts an output value of the second multiplier from an output value of the first multiplier.

20. The modulator of claim 16, wherein the first, second, and third variable capacitors are MEMS elements.

\* \* \* \* \*